United States Patent [19]
Schmitt et al.

[11] Patent Number: 5,963,057
[45] Date of Patent: Oct. 5, 1999

[54] CHIP LEVEL BIAS FOR BUFFERS DRIVING VOLTAGES GREATER THAN TRANSISTOR TOLERANCE

[75] Inventors: Jonathan Schmitt, Bloomington; Paul Torgerson, Inver Grove Heights, both of Minn.

[73] Assignee: LSI Logic Corporation, Milpitas, Calif.

[21] Appl. No.: 08/910,730

[22] Filed: Aug. 13, 1997

Related U.S. Application Data

[63] Continuation-in-part of application No. 08/906,343, Aug. 5, 1997.

[51] Int. Cl.$^6$ .................................................. H03K 19/00
[52] U.S. Cl. ................................ 326/103; 326/81; 326/47
[58] Field of Search ................................ 326/41, 47, 101, 326/102, 103, 81

[56] References Cited

U.S. PATENT DOCUMENTS

| | | | |
|---|---|---|---|
| 4,978,633 | 12/1990 | Seefeldt et al. | 438/113 |
| 5,001,487 | 3/1991 | Suzuki et al. | 257/205 |
| 5,003,204 | 3/1991 | Cushing et al. | 326/40 |
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,467,031 | 11/1995 | Nguyen et al. | 326/81 |
| 5,537,059 | 7/1996 | Asahina | 326/81 |
| 5,559,464 | 9/1996 | Orii et al. | 327/333 |
| 5,736,869 | 4/1998 | Wei | 326/81 |

*Primary Examiner*—Michael Tokar
*Assistant Examiner*—Richard Roseen
*Attorney, Agent, or Firm*—Westman, Champlin & Kelly P.A.

[57] ABSTRACT

An integrated circuit includes a core region and an input-output (I/O) region which has an I/O slot and a voltage supply slot. First and second voltage supply buses and a bias voltage bus extend along the I/O region through the I/O slot and the voltage supply slot. A bias voltage generator is fabricated in the voltage supply slot and is electrically coupled between the first and second voltage supply buses. The bias voltage generator has a bias voltage output which is electrically coupled to the bias voltage bus. A buffer is fabricated in the I/O slot for interfacing with the core region. The buffer includes a bias voltage input which is electrically coupled to the bias voltage bus.

19 Claims, 3 Drawing Sheets

CHIP LEVEL BIAS FOR BUFFERS DRIVING VOLTAGES GREATER THAN TRANSISTOR TOLERANCE

CROSS-REFERENCE TO RELATED APPLICATION

This is a continuation-in-part of U.S. application Ser. No. 08/906,343, filed Aug. 5, 1997, which is entitled "Integrated Circuit I/O Buffer Having Pull-up To Voltages Greater Than Transistor Tolerance" and is assigned to the same assignee.

BACKGROUND OF THE INVENTION

The present invention relates to semiconductor integrated circuits, and more particularly, to an output buffer having a chip level bias for driving voltages off of an integrated circuit at a level that is greater than transistor tolerances.

Advancements in semiconductor integrated circuit fabrication technology enable the geometries of semiconductor devices to be progressively reduced so that more devices can fit on a single integrated circuit. As a result, core voltages of the integrated circuits are being reduced to prevent damage to the small devices and to reduce power consumption. For example, power supplies are now being reduced from 5V to 3.3V, and from 3.3V to 2.5V.

These low voltage devices are often interconnected at a board level to TTL logic and other devices that operate at higher supply voltages of 5V or 3.3V. If no precautions are taken, an external 3.3V level signal applied to the output terminal of a 2.5V I/O buffer can cause voltage drops across the transistor devices in the I/O buffer that exceed the transistor tolerances, which can cause the gate oxide of the transistors to break down. I/O buffers are therefore being developed to interface with large voltages without exceeding the tolerance levels of the devices within the integrated circuit.

SUMMARY OF THE INVENTION

The integrated circuit of the present invention includes a core region and an input-output (I/O) region which has an I/O slot and a voltage supply slot. First and second voltage supply buses and a bias voltage bus extend along the I/O region through the I/O slot and the voltage supply slot. A bias voltage generator is fabricated in the voltage supply slot and is electrically coupled between the first and second voltage supply buses. The bias voltage generator has a bias voltage output which is electrically coupled to the bias voltage bus. A buffer is fabricated in the I/O slot for interfacing with the core region. The buffer includes a bias voltage input which is electrically coupled to the bias voltage bus.

In one embodiment, the bias voltage generator includes resistor tree and a feedback circuit having an input and an output which are coupled to the bias voltage output. The feedback circuit pulls the bias voltage output low when the voltage level on the bias voltage output exceeds a predetermined threshold. The feedback circuit provides a low resistance path to ground which prevents the voltage level on the bias voltage output from building up.

The buffer includes a core terminal and a pad terminal. A pull-up transistor is coupled between the first voltage supply bus and the pad terminal and has a pull-up control terminal. A pull-up control circuit is coupled between the core terminal and the pull-up control terminal. A pull-up voltage protection transistor is coupled between the pull-up transistor and the pad terminal and has a control terminal coupled to the bias voltage bus. A pull-down transistor coupled between the second voltage supply bus and the pad terminal and has a pull-up control terminal. A pull-down control circuit coupled between the core terminal and the pull-down control terminal. A pull-down voltage protection transistor is coupled between the pad terminal and the pull-down transistor.

The biasing of the pull-up and pull-down transistors and the voltage protection transistors allows the buffer to drive and receive voltages on the pad terminal which are greater than the voltage tolerances of the transistors in the buffer.

DETAILED DESCRIPTION OF THE PREFERRED EMBODIMENTS

Figure 1:
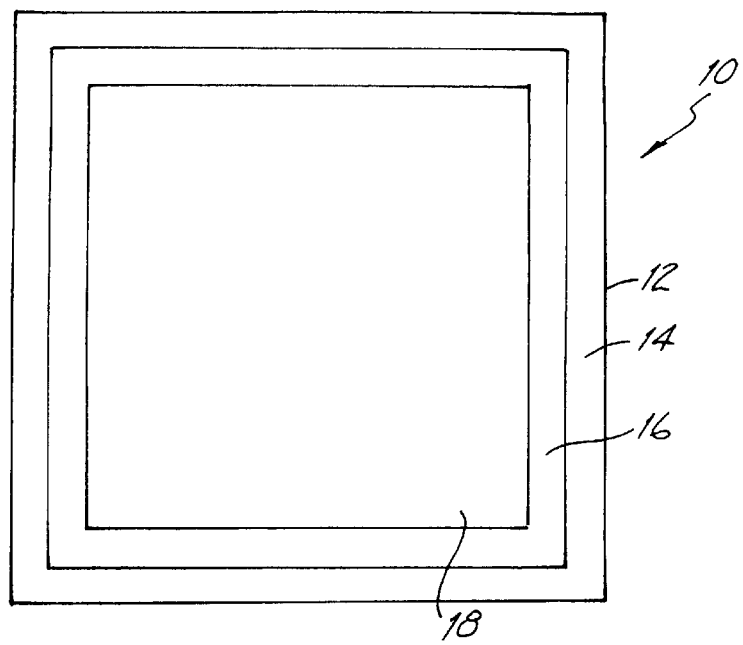
FIG. 1 is a plan view of a semiconductor die according to the present invention.

FIG. 1 is a plan view of a semi-conductor die on which the integrated circuit of the present invention is fabricated. Die 10 is fabricated with a 2.5V fabrication process, for example. Die 10 includes perimeter 12, scribe region 14, I/O region 16 and core region 18. I/O region 16 and core region 18 each have a plurality of semiconductor devices or cells. I/O region 16 extends along scribe region 14 and surrounds core region 18. Die 10 has a plurality of routing layers for routing interconnections between the devices within I/O region 16 and core region 18. Each interconnection or "wire" includes one or more segments of conductive material which is routed in a specified pattern within the various routing layers on die 10. Each routing layer is separated from the other routing layers by a dielectric layer.

Figure 2:
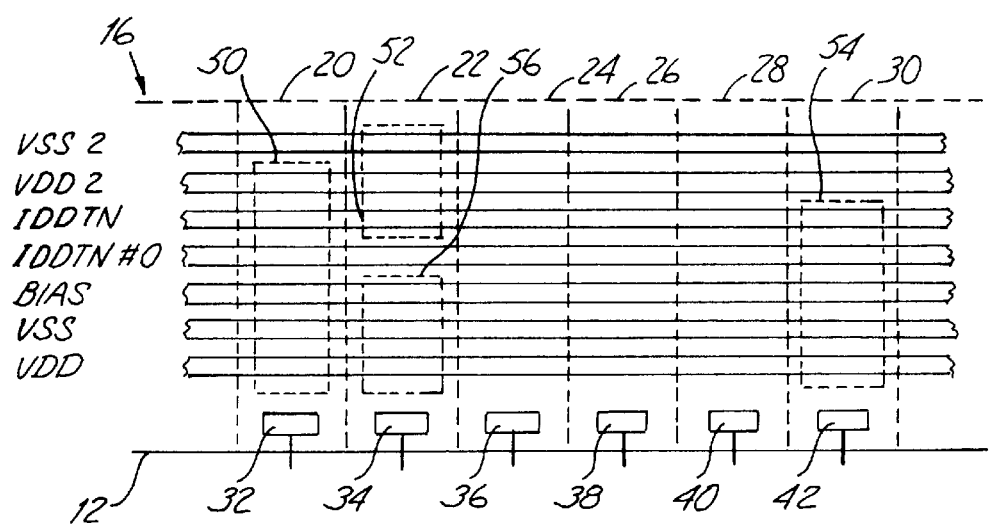
FIG. 2 is a fragmentary, plan view of an I/O region within the semiconductor die shown in FIG. 1.

FIG. 2 is fragmentary plan view of I/O region 16. I/O region 16 includes I/O slot 20, voltage supply slots 22, 24, 26 and 28 and I/O slot 30. Slots 20, 22, 24, 26, 28 and 30 include pads 32, 34, 36, 38, 40 and 42, respectively. Pads 32, 34, 36, 38, 40 and 42 provide an electrical connection to the pins of the integrated circuit package in which die 10 is housed.

A plurality of global buses extend along I/O region 16, generally parallel to perimeter 102. These buses include I/O voltage supply buses VDDIO and VSSIO, core voltage supply buses VDD2 and VSS2, bias voltage bus BIAS and DC current test buses IDDTN and IDDTNHO. Voltage supply buses VDDIO and VSSIO are coupled to an external power supply through pads 34 and 36, respectively, for supplying and I/O supply voltage to selected devices within I/O region 16. In one embodiment, the external power supply coupled to buses VDDIO and VSSIO supply a 3.3V I/O supply voltage. Voltage supply buses VDD2 and VSS2 are coupled to an external power supply through pads 38 and 40, respectively, for supplying a core supply voltage to selected devices within I/O region 16 and the devices within core region 18. In one embodiment, the external power supply coupled to buses VDD2 and VSS2 supplies a 2.5V core supply voltage.

Output buffer 50 (shown in phantom) is fabricated within I/O slot 20 for interfacing between pad 32 and core region 18 (shown in FIG. 1). As shown in more detail in FIG. 4, output buffer 50 is coupled to each of the supply buses VDDIO, VSSIO, VDD2 and VSS2 and has a bias input coupled to bias voltage bus BIAS. Bias voltage generator 52 is fabricated within a dedicated area of the voltage supply slots, such as voltage supply slot 22. Bias voltage generator 52 is electrically coupled between I/O supply buses VDDIO and VSSIO and generates a bias voltage on bias voltage bus BIAS, which is used for biasing the various I/O buffers in I/O region 16, such as I/O buffer 50. Since bias voltage generator 52 consumes semiconductor die area, the bias voltage generator is preferably fabricated within one of the voltage supply slots and the bias voltage is routed as a global bus, rather than repeating the bias voltage generator in each of the I/O slots.

I/O buffer 54 is fabricated within I/O slot 30. I/O buffer 54 is configured as an input-only buffer for receiving a DC current test signal IDDT on pad 42 and generating an inverted test signal on DC current test bus IDDTN. During DC current testing, the test signal IDDT supplied to pad 42 is set to an active state, such as a logic high level. The inverted test signal on bus IDDTN is used to shut off all sources of DC current in semiconductor die 10. The DC current drawn through voltage supply pads 34, 36, 38 and 40 is then measured. If the measured current exceeds a specified tolerance, there may be a short or some other fault condition in semiconductor die 10.

Voltage level shifting circuit 56 is fabricated in voltage supply slot 22 and is coupled between buses IDDTN and IDDTNHO. Voltage level shifting circuit 56 inverts the DC current test signals received on bus IDDTN and shifts the voltage swing of the signals from 0V–2.5V to about 0.8V–3.0V on bus IDDTNHO. Voltage level shifting circuit 56 is described in more detail in U.S. application Ser. No. 08/906,343, filed Aug. 5, 1997 and is entitled "Integrated Circuit I/O Buffer Having Pull-up To Voltages Greater Than Transistor Tolerance," which is assigned to the same assignee and is hereby incorporated by reference.

Figure 3:
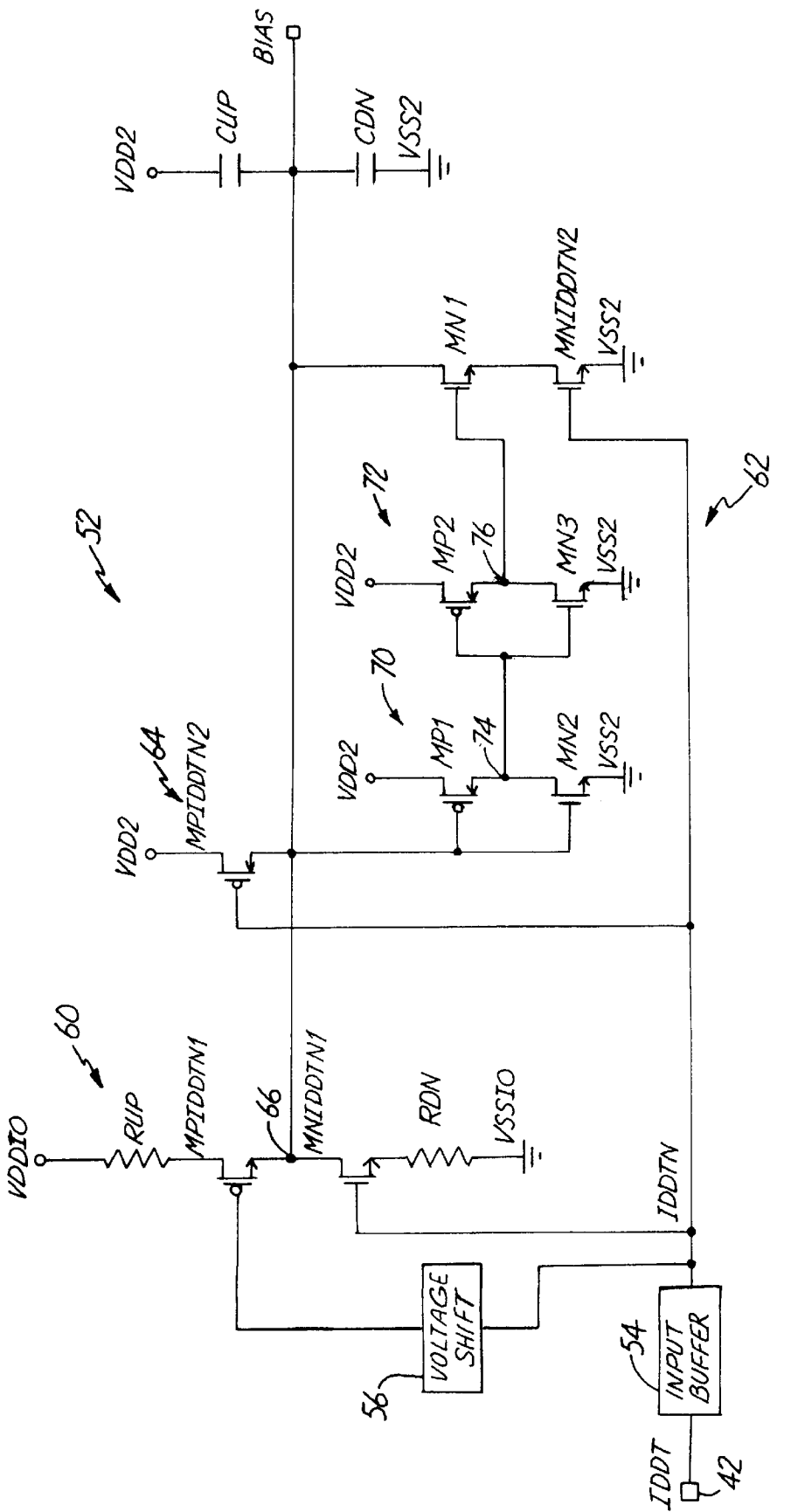
FIG. 3 is schematic diagram of a voltage bias generator fabricated within the I/O region shown in FIG. 2.

FIG. 3 is a schematic diagram of bias voltage generator 52, which is electrically coupled to input buffer 54. Bias voltage generator 52 includes voltage divider 60, feedback circuit 62, pull-up device 64 and power supply decoupled capacitors CUP and CDN. Voltage divider 60 includes pull-up resistor RUP, pull down resistor RDN and decoupling transistors MPIDDTN1 and MNIDDTN1. Pull-up resistor RUP is coupled between voltage supply bus VDDIO, which is at 3.3V, and decoupling transistor MPIDDTN1. Decoupling transistor MPIDDTN1 has a gate coupled to DC current test bus IDDTNHO, a source coupled to bias voltage output 66 and a drain coupled to pull-up resistor RUP. Pull down resistor RDN is coupled between voltage supply bus VSSIO and decoupling transistor MNIDDTN1. Decoupling transistor MNIDDTN1 has a gate coupled to DC current test bus IDDTN, a source coupled to pull down resistor RDN and a drain coupled to bias voltage output 66. Bias voltage output 66 is coupled to bias voltage bus BIAS.

Voltage divider 60 generates a selected voltage level on bias voltage output 66, such as 0.8V–1.0V. In one embodiment, pull-up resistor RUP includes a 40 KΩ resistor and pull down resistor RDN and includes a 16.5 KΩ resistor. During normal operation, DC current test bus IDDTN is high and DC current test bus IDDTNHO is low, which turns on transistors MPIDDTN1 and MNIDDTN1 and couples pull-up resistor RUP and pull down resistor RDN to bias voltage output 66. In a test mode, DC current test bus IDDTN is low and DC current test bus IDDTNHO is high, which turns off transistors MPIDDTN1 and MNIDDTN1 and decouples pull-up resistor RUP and pull down resistor RDN from bias voltage output 66. This shuts off any DC current flowing through voltage divider 60.

Pull-up device 64 includes P-channel transistor MPIDDTN2, which has a gate coupled to DC current test bus IDDTN, a source coupled to voltage supply bus VDD2 and a drain coupled to bias voltage output 66. In test mode, the low level on IDDTN turns on transistor MPIDDTN2 which pulls bias voltage output 66 to a defined voltage such as 2.5V.

Feedback circuit 62 includes inverters 70 and 72, pull-down transistor MN1 and decoupling transistor MNIDDTN2. Inverter 70 includes N-channel transistor MN2 and P-channel transistor MP1. Transistor MN2 has a gate coupled to bias voltage output 66, a source coupled to voltage supply terminal VSS2 and a drain coupled to inverter output 74. Transistor MP1 has a gate coupled to bias voltage output 66, a source coupled to voltage supply terminal VDD2 and a drain coupled to inverter output 74. Inverter 72 includes N-channel transistor MN3 and P-channel transistor MP2. Transistor MN3 has a gate coupled to inverter output 74, a source coupled to voltage supply terminal VSS2 and a drain coupled to inverter output 76. Transistor MP2 has a gate coupled to inverter output 74, a source coupled to voltage supply terminal VDD2 and a drain coupled to inverter output 76. Pull-down transistor MN1 has a gate coupled to inverter output 76, a source coupled to the drain of decoupling transistor MNIDDTN2 and a drain coupled to bias voltage output 66. Decoupling transistor MNIDDTN2 has a gate coupled to DC current test bus IDDTN and a source coupled to voltage supply terminal VSS2.

During operation, feedback circuit 62 is on only when the voltage level on bias voltage bus BIAS is above a certain threshold level. Above the threshold level, transistor MN2 turns on, pulling inverter output 74 low which turns on transistor MP2. Transistor MP2 pulls inverter output 76 high which turns on transistor MN1, thereby pulling bias voltage bus BIAS back low toward the threshold. Bias voltage bus BIAS is essentially used as an elevated ground for the I/O buffers in I/O region 16 (shown in FIG. 2). Bias voltage bus BIAS therefore conducts a fair amount of current and should have a fairly low resistance path to ground to prevent the voltage level on the bus from building up. Feedback circuit 62 provides a low resistance path to ground without significantly increasing current through the resistance path since the feedback circuit is on only when the voltage level on bias voltage bus BIAS exceeds the threshold level.

Power supply decoupling capacitors CUP and CDN are coupled between bias voltage bus BIAS and voltage supply terminals VDD2 and VSS2, respectively, for suppressing noise in the voltage level on bias voltage bus BIAS. Noise is created when a transistor in I/O region 16 that is coupled to bias voltage bus BIAS changes its output state. The transistor either sinks current from the bus to supply charge to the interconnect capacitance at the transistor output or sources current to the bus to discharge the interconnect capacitance. Power supply decoupling capacitors CUP and CDN have relatively large capacitances, such as 12 pF and 9 pF, respectively, for holding charge that can be used as needed by the I/O transistors.

Power supply decoupling capacitors CUP and CDN are preferably fabricated within the voltage supply slot in which voltage bias generator 52 is fabricated. Power supply decoupling capacitors CUP and CDN can be formed by applying overlapping conductive segments in two parallel routing layers which are separated by a dielectric layer on the die. The opposing conductive segments are then electrically coupled to bias voltage bus BIAS and the respective voltage supply terminal VDD2 or VSS2 to form the capacitor. In a preferred embodiment, the conductive segments that form decoupling capacitors CUP and CDN substantially fill the available routing area that is dedicated for voltage bias generator 52. This maximizes the decoupling capacitance and thus the charge sharing capacity of the capacitors. These capacitors are described in more detail in U.S. application Ser. No. 08/819,299, filed Mar. 18, 1997 and entitled Semiconductor Die Having On-Die De-Coupling Capacitance, which is hereby incorporated by reference. Capacitors CUP and CDN can also be formed by PMOS and NMOS transistors having their gates coupled to bias voltage bus BIAS and their sources and drains coupled to VSS2 for PMOS transistors and VDD2 for NMOS transistors.

Figure 4:
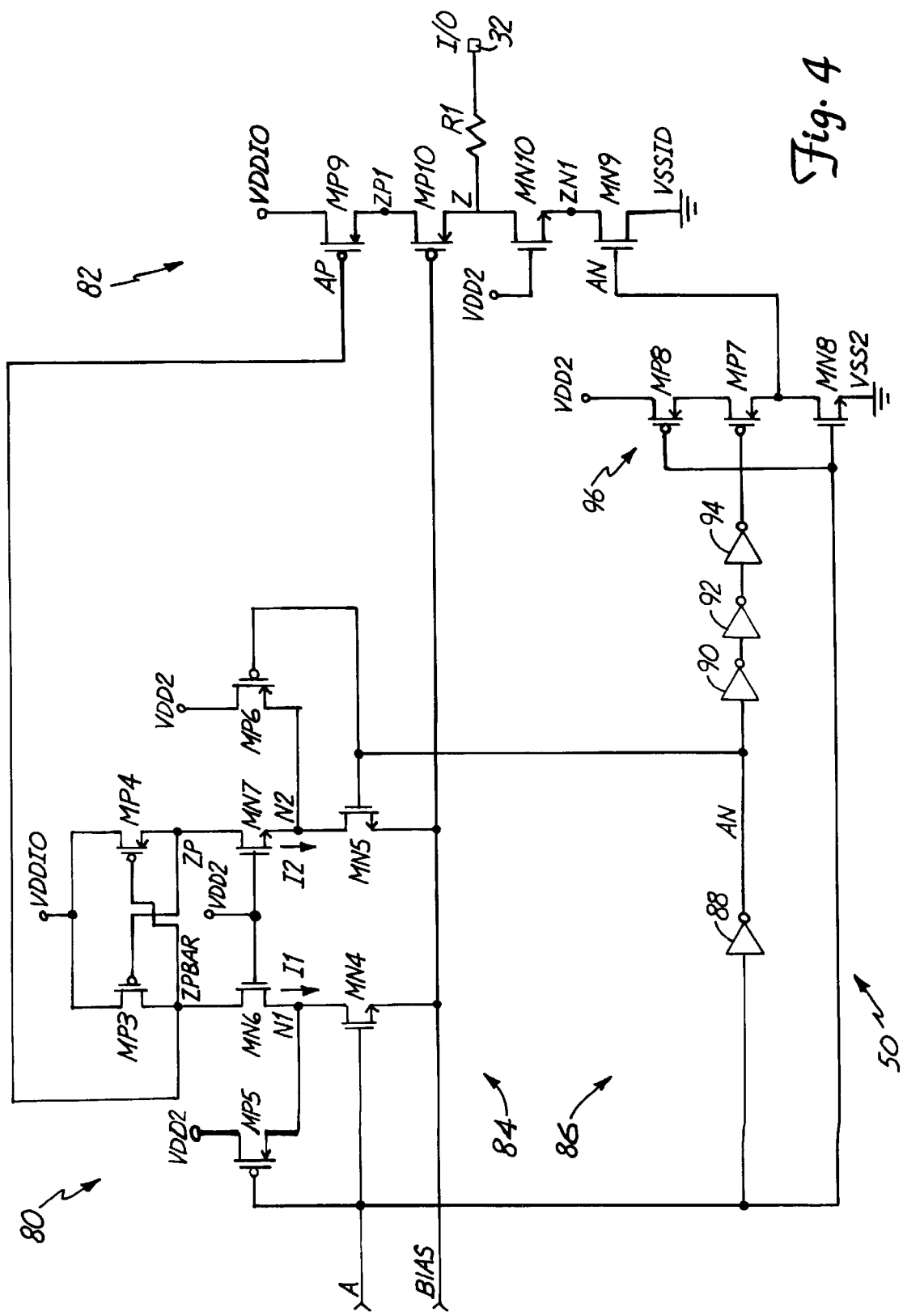
FIG. 4 is a schematic diagram of an I/O buffer which is biased by the bias voltage generator shown in FIG. 3.

FIG. 4 is a schematic diagram of I/O buffer 50 which is fabricated within I/O slot 20 (shown in FIG. 2). In the embodiment shown, I/O buffer 50 is configured as an output-only buffer which receives 0V–2.5V data signals from core region 18 on core terminal A and supplies 0V–3.3V output signals on pad 32. I/O buffer 50 includes predriver stage 80 and output driver stage 82. Predriver stage 80 includes pull-up control circuit 84 and pull-down control circuit 86 for controlling the pull-up and pull-down of pad 32 in response to the data signals applied to core terminal A. Each transistor in predriver stage 80 and output driver stage 82 is biased such that the gate-to-source, gate-to-bulk and gate-to-drain voltages are all less than a 3.0V tolerance to prevent damage to the transistors while driving or receiving 0V–3.3V data signals on pad 32. Also, each transistor is biased such that all drain-to-source voltage are less than a 2.75V tolerance for minimum sized transistors.

Pull-up control circuit 84 includes a voltage level shifting differential amplifier formed by inverter 88, N-differential transistor pair MN4 and MN5, N-channel voltage protection transistors MN6 and MN7, P-channel cross-coupled transistor pair MP3 and MP4 and charge boosting transistors MP5 and MP6. Inverter 88 is coupled between core terminal A and inverted data terminal AN. Transistor MN4 has a gate coupled to core terminal A, a source coupled to bias voltage bus BIAS and a drain coupled to node N1. Transistor MN5 has a gate coupled to inverted data terminal AN, a source coupled to bias voltage bus BIAS and a drain coupled to node N2. The drains of transistors MN4 and MN5 define first and second current paths I1 and I2 within the differential amplifier. The gates of voltage protection transistors MN6 and MN7 are coupled to voltage supply terminal VDD2, which is at 2.5V. The sources of transistors MN6 and MN7 are coupled to nodes N1 and N2, respectively. The drains of transistors MN6 and MN7 are coupled to nodes ZPBAR and ZP, respectively.

Transistors MP3 and MP4 are cross-coupled to one another, with the gate of transistor MP3 coupled to the drain of transistor MP4 at node ZP and the gate of transistor MP4 coupled to the drain of transistor MP3 at node ZPBAR. The sources of transistors MP3 and MP4 are coupled to voltage supply terminal VDDIO, which is at 3.3V. Node ZPBAR is coupled to pull-up control terminal AP. Charge boosting transistor MP5 has a gate coupled to core terminal A, a source coupled to voltage supply terminal VDD2 and a drain coupled to node N1. Charge boosting transistor MP6 has a gate coupled to inverted data terminal AN, a source coupled to voltage supply terminal VDD2 and a drain coupled to node N2.

Pull-up control circuit 84 receives the 0V–2.5V data signals on core terminal A and generates inverted and level-shifted 0.8V–3.3V pull-up control signals on node ZPBAR. When core terminal A is high at 2.5V, transistor MN4 is on and transistor MN5 is off. Transistor MN4 pulls current through current path I1, which discharges nodes N1 and ZPBAR toward the voltage level on bias voltage bus BIAS, which is at about 0.8V–1.0V. A high, 2.5V voltage on core terminal A therefore results in a low, 0.8V voltage on node ZPBAR. The raised voltage level on bias voltage bus BIAS prevents an over voltage condition from the drain-to-source of transistor MP3 when node ZPBAR is pulled low. Extra protection can be obtained by lengthening the gate of transistor MP3 (and transistor MP4) to handle variations in the voltage on voltage supply bus VDDIO.

The low voltage on node ZPBAR turns on transistor MP4 which charges nodes ZP and N2 toward 3.3V. Charge boosting transistor MP6 is a pull-up transistor which assists transistor MP4 in charging node N2 when the voltage on core terminal A is high. The high voltage on node ZP turn off transistor MP3. As node N2 reaches an NMOS threshold voltage below the 2.5V level on the gate of transistor MN7, transistor MN7 turns off and thereafter prevents further charging of node N2. This prevents the gate-to-drain voltage of transistor MN5 from exceeding the 3.0V tolerance.

When the voltage on core terminal A is low, transistor MN4 is off and transistor MN5 is on. Transistor MN5 discharges nodes N2 and ZP toward 0.8V. The low voltage on node ZP turns on transistor MP3 which charges nodes ZPBAR and N1 toward 3.3V. Charge boosting transistor MP5 is pull-up transistor which assists transistor MP3 in charging node N1 when the data on core terminal A is low. As node N1 reaches an NMOS threshold voltage below 2.5V, transistor MN6 turns of since its gate is tied to voltage supply terminal VDD2. This prevents further charging of node N1 and thereby protects transistor MN4 from an over voltage condition. The high voltage on node ZPBAR turns off transistor MP4. The low, 0V voltage on core terminal A therefore results in a high, 3.3V voltage on node ZPBAR.

Pull-down control circuit 86 receives the 0V–2.5V data signals on core terminal A and generates inverted, 0V–2.5V pull-down control signals on pull-down control terminal AN. Pull-down control circuit 86 includes inverters 88, 90, 92, 94 and 96 which are coupled together in series between core terminal and pull-down control terminal AN. Inverters 88, 90, 92 and 94 form a delay line to the input of inverter 96. Inverter 96 includes N-channel transistor MN7 and P-channel transistors MP7 and MP8. Transistor MN8 has a gate coupled to core terminal A, a source coupled to voltage supply terminal VSS2 and a drain coupled to pull-up control terminal AN. Transistor MP7 has a gate coupled to the output of inverter 94, a source coupled to the drain of transistor MP8 and drain coupled to pull-down control terminal AN. Transistor MP8 has a gate coupled to core terminal A and a source coupled to voltage supply terminal VDD2. A low-to-high transition on core terminal A bypasses the delay line formed by inverters 88, 92 and 94 and quickly pulls terminal AN low through transistor MN8. A high-to-low transition on core terminal A must pass through the delay line before pulling terminal AN high through transistors MP7 and MP8.

Output driver stage 82 includes P-channel pull-up transistor MP9, P-channel voltage protection transistor MP10, N-channel pull-down transistor MN9 and N-channel voltage protection transistor MN10 which are coupled together in series between voltage supply terminal VDDIO and voltage supply terminal VSSIO. Pull-up transistor MP9 has a gate coupled to pull-up control terminal AP, a source coupled to voltage supply terminal VDDIO and a drain coupled to node ZP1. Voltage protection transistor MP10 has a gate coupled to bias voltage bus BIAS, a source coupled to node ZP1 and a drain coupled to output node Z. Pull-down transistor MN9 has a gate coupled to pull-down control terminal AN, a source coupled to voltage supply terminal VSSIO and drain coupled to node ZN1. Voltage protection transistor MN10 has a gate coupled to voltage supply terminal VDD2, a source coupled to node ZN1 and a drain coupled to output node Z. Electrostatic discharge (ESD) protection resistor R1 is coupled between output node Z and pad 32.

When the data on core terminal A is at 2.5V, pull-up control terminal AP is at 0.8V and pull-down control terminal AN is at 0V. Pull-up transistor MP9 is on and pull-down transistor MN9 is off. Pull-up transistor MP9 charges nodes ZP1, Z and ZN1 toward 3.3V. As node ZN1 reaches an NMOS threshold voltage below the gate of voltage protection transistor MN10, which is at 2.5V, transistor MN10 turns off. This prevents further charging of node ZN1 and an over voltage condition with respect to the gate of pull-down transistor MN9 which is at 0V. When the data on core terminal A is at 0V, pull-up control terminal AP is at 3.3V and pull-down control AN is at 2.5V. Pull-up transistor MP9 is off and pull-down transistor MN9 is on. Pull-down transistor MN9 discharges nodes ZN1, Z and ZP toward 0V. As node ZP1 drops below the voltage on the gate of voltage protection transistor MP10, transistor MP10 turns off preventing further discharge of node ZP1 and an over voltage condition with respect to the gate of pull-up transistor MP9 which is at 3.3V. I/O buffer 50 therefore drives 0V–3.3V data signals on I/O pad 32 without exceeding the transistor tolerances of any of the transistors in the circuit.

Fabricating the voltage bias generator in one of the voltage supply slots in the I/O region and routing the bias voltage output as a global bus, as opposed to fabricating the bias voltage generator in each I/O slot, conserves semiconductor real estate and reduces power consumption. The bias voltage generator generates a bias voltage level with two ratioed N-well resistors rather than transistor biasing. The bias voltage level is therefore substantially independent of transistor characteristic variations. The bias voltage generator has a very low DC current since the feedback circuit is on only when the voltage level on the bias voltage bus exceeds a predetermined threshold level. In one embodiment, the bias voltage generator has a worst case DC current of about 50 microamperes.

Another advantage of fabricating the bias voltage generator in the voltage supply slots is that the current drawn the by the bias voltage generator is dependent on the number of voltage supply slots rather than the number of I/O slots. Yet another advantage of the bias voltage generator is that the bias voltage level is dependent on the level of the I/O supply voltage. When the I/O supply voltage level increases, the bias voltage level increases and thus the voltage protection provided by the raised bias voltage level also increases.

Although the present invention has been described with reference to preferred embodiments, workers skilled in the art will recognize that changes may be made in form and detail without departing from the spirit and scope of the invention. For example, the present invention can be implemented with various technologies, including CMOS, and can have a variety of circuit configurations. The transistors shown in the figures can include individual transistors or an array of transistors coupled together in parallel with one another. Also, the voltage supply terminals can be relatively positive or relatively negative, depending upon the particular convention adopted and the technology used. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. An integrated circuit comprising:

a core region;

an input-output (I/O) region comprising an I/O slot and a voltage supply slot;

first and second voltage supply buses and a bias voltage bus which extend along the I/O region through the I/O slot and the voltage supply slot;

a bias voltage generator fabricated in the voltage supply slot and electrically coupled between the first and second voltage supply buses and comprising a bias voltage output electrically coupled to the bias voltage bus; and a buffer fabricated in the I/O slot and interfacing with the core region, the buffer comprising a bias voltage input electrically coupled to the bias voltage bus.

2. The integrated circuit of claim 1 wherein the bias voltage generator further comprises a feedback circuit having an input and an output which are coupled to the bias voltage output.

3. The integrated circuit of claim 2 wherein the feedback circuit comprises a self-fed inverter circuit.

4. The integrated circuit of claim 2 wherein the feedback circuit comprises a pull-down transistor, which is coupled to the bias voltage output and has a control terminal, and first and second inverters which are coupled in series between the bias voltage output and the control terminal of the pull-down transistor.

5. The integrated circuit of claim 4 and further comprising:

a DC current test terminal for receiving a test signal;

third and fourth voltage supply buses which extend along the I/O region through the I/O slot and the voltage supply slot for supplying a core voltage; and a decoupling transistor coupled between the pull-down transistor and the fourth voltage supply bus and having a control terminal coupled to the DC current test terminal.

6. The integrated circuit of claim 1 and further comprising:

a DC current test terminal for receiving a test signal; and a pull-up transistor coupled to the bias voltage output and having a control terminal coupled to the DC current test terminal.

7. The integrated circuit of claim 1 wherein the bias voltage generator further comprises a resistive voltage divider.

8. The integrated circuit of claim 7 and further comprising:

a DC current test terminal for receiving a test signal;

a first decoupling transistor coupled in the voltage divider between the first voltage supply terminal and the bias voltage output and having a control terminal coupled to the DC current test terminal; and a second decoupling transistor coupled in the voltage divider between the second voltage supply terminal and the bias voltage output and having a control terminal coupled to the DC current test terminal.

9. The integrated circuit of claim 8 and further comprising a voltage level shifting circuit coupled between the DC current test terminal and the control terminal of the first decoupling transistor.

10. The integrated circuit of claim 1 wherein the bias voltage generator further comprises power supply decoupling capacitors which are coupled to the bias voltage output.

11. The integrated circuit of claim 10 wherein:
the voltage supply slot comprises first and second routing layers which are separated by a dielectric layer and comprises a routing area which is dedicated to the bias voltage generator;
the decoupling capacitors each comprise first and second conductive segments which are placed in the first and second routing layers, respectively, and overlap one another; and
the first and second conductive segments of the decoupling capacitors substantially fill the routing area dedicated to the bias voltage generator.

12. The integrated circuit of claim 1 wherein the buffer further comprises:
a core terminal coupled to the core region;
a pad terminal;
a pull-up transistor coupled between the first voltage supply bus and the pad terminal and having a pull-up control terminal;
a pull-down transistor coupled between the second voltage supply bus and the pad terminal and having a pull-up control terminal;
a pull-up control circuit coupled between the core terminal and the pull-up control terminal; and
a pull-down control circuit coupled between the core terminal and the pull-down control terminal.

13. The integrated circuit of claim 12 wherein the buffer further comprises:
a pull-up voltage protection transistor coupled between the pull-up transistor and the pad terminal and having a control terminal coupled to the bias voltage bus.

14. The integrated circuit of claim 12 and further comprising a core supply bus for supplying a core voltage and wherein the buffer further comprises:
a pull-down voltage protection transistor coupled between the pad terminal and the pull-down transistor and having a control terminal coupled to the core supply bus.

15. The integrated circuit of claim 12 wherein the pull-down control circuit comprises an inverter circuit.

16. The integrated circuit of claim 12 and further comprising:
third and fourth voltage supply buses for supplying a core voltage;
wherein the first and second voltage supply buses supply an I/O voltage which is greater than the core supply voltage; and
wherein the pull-up control circuit comprises a voltage level shifting differential amplifier circuit having an input biased between the third and fourth voltage supply buses and an output biased between the first voltage supply bus and the bias voltage bus.

17. An integrated circuit comprising:
a core region;
an input-output (I/O) region comprising an I/O slot and a voltage supply slot;
first and second I/O voltage supply buses, first and second core supply buses and a bias voltage bus which extend along the I/O region through the I/O slot and the voltage supply slot;
a bias voltage generator fabricated in the voltage supply slot and electrically comprising a bias voltage output electrically coupled to the bias voltage bus;
a buffer fabricated in the I/O slot and comprising:
a core terminal and a pad terminal;
a pull-up transistor coupled between the first I/O voltage supply bus and the pad terminal and having a pull-up control terminal;
a pull-up voltage protection transistor coupled between the pull-up transistor and the pad terminal and having a control terminal coupled to the bias voltage bus;
a pull-up control circuit coupled between the core terminal and the pull-up control terminal;
a pull-down transistor coupled between the second I/O voltage supply bus and the pad terminal and having a pull-up control terminal; and
a pull-down control circuit coupled between the core terminal and the pull-down control terminal.

18. The integrated circuit of claim 17 wherein the pull-up control circuit has an output which is coupled to the pull-up control terminal and is biased between the first I/O voltage supply bus and the bias voltage bus.

19. The integrated circuit of claim 18 wherein the pull-up control circuit comprises a voltage level shifting differential amplifier.

* * * * *